United States Patent
Wang (10) Patent No.: US 7,676,708 B2
(45) Date of Patent: Mar. 9, 2010

(54) SEMICONDUCTOR INTEGRATED CIRCUIT WITH FULL-SPEED DATA TRANSITION SCHEME FOR DDR SDRAM AT INTERNALLY DOUBLED CLOCK TESTING APPLICATION

(75) Inventor: Ming-Hung Wang, Hsin Chu (TW)

(73) Assignee: Etron Technology, Inc., Hsin-Chu (TW)

( * ) Notice: Subject to any disclaimer, the term of this patent is extended or adjusted under 35 U.S.C. 154(b) by 0 days.

(21) Appl. No.: 12/220,034

(22) Filed: Jul. 21, 2008

(65) Prior Publication Data

US 2008/0279023 A1    Nov. 13, 2008

Related U.S. Application Data

(62) Division of application No. 10/293,576, filed on Nov. 13, 2002, now Pat. No. 7,404,116.

(51) Int. Cl.
    *G11C 29/00* (2006.01)
(52) U.S. Cl. ...................................... 714/718
(58) Field of Classification Search .................. 714/718; 365/201, 233.13

See application file for complete search history.

(56) References Cited

U.S. PATENT DOCUMENTS

| | | | |
|---|---|---|---|
| 6,043,694 A | 3/2000 | Dortu | |
| 6,154,419 A | 11/2000 | Shakkarwar | |
| 6,337,830 B1 | 1/2002 | Faue | |
| 6,574,163 B2 * | 6/2003 | Maeda | 365/233.11 |

* cited by examiner

*Primary Examiner*—James C Kerveros
(74) *Attorney, Agent, or Firm*—Saile Ackerman LLC; Stephen B. Ackerman (57) ABSTRACT

The present invention provides a circuit and a method for the full speed testing of semiconductor memory chips. The invention provides a full-speed data transition scheme for double data rate (DDR) synchronous dynamic random access memory (SDRAM). For high speed or double speed stress testing of DDR SDRAM, the internal clock is double the speed of the external clock. During high speed test, this causes the data to be written or presented to the data path two times. This invention provides a circuit and method for creating a full-speed data transition scheme to overcome this double speed testing problem.

18 Claims, 7 Drawing Sheets

SEMICONDUCTOR INTEGRATED CIRCUIT WITH FULL-SPEED DATA TRANSITION SCHEME FOR DDR SDRAM AT INTERNALLY DOUBLED CLOCK TESTING APPLICATION

This is a Divisional application of U.S. patent application Ser. No. 10/293,576, filed on Nov. 13, 2002, now U.S. Pat. No. 7,404,116, which is herein incorporated by reference in its entirety, and assigned to a common assignee.

BACKGROUND OF THE INVENTION

1. Field of the Invention

The present invention generally relates to the full speed testing of semiconductor memory chips. More particularly, this invention relates to a full-speed data transition scheme for double data rate (DDR) synchronous dynamic random access memory (SDRAM).

2. Description of the Prior Art

Figure 1:
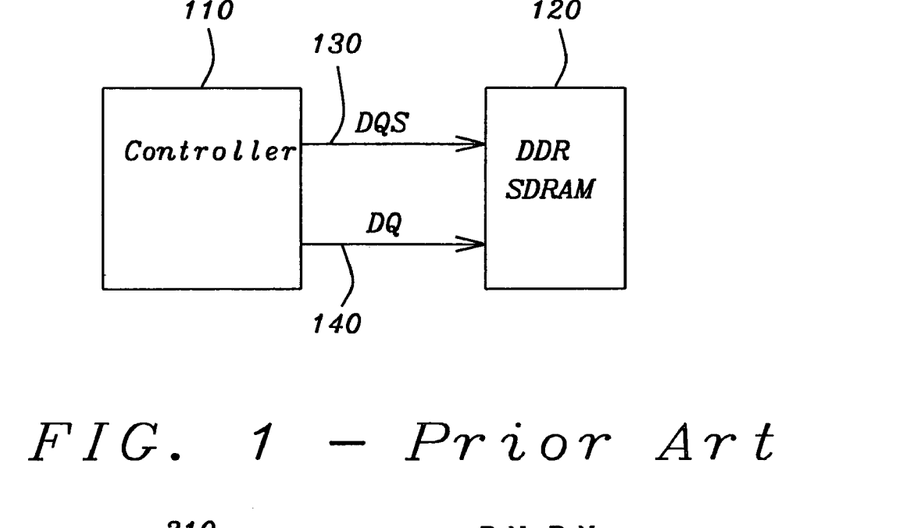
FIG. 1 shows a prior art high level block diagram.

FIG. 1 shows a high-level block diagram of the interface between a memory controller 110 and a double data rate (DDR) synchronous dynamic random access memory (SDRAM) 120. The strobe signal, DQS, 130 strobe data at the proper time into the memory. The data or DQ 140 represents the data bus into the memory.

DQ means Data and Quest. In other words, "Data" means the controller sends any input data to memory and "Quest" means memory drives out any output data for the controller's pursuit. DQS means Data Quest Strobe. It works as a synchronous clock signal between the controller and memory to align and sample DQ.

Figure 2:
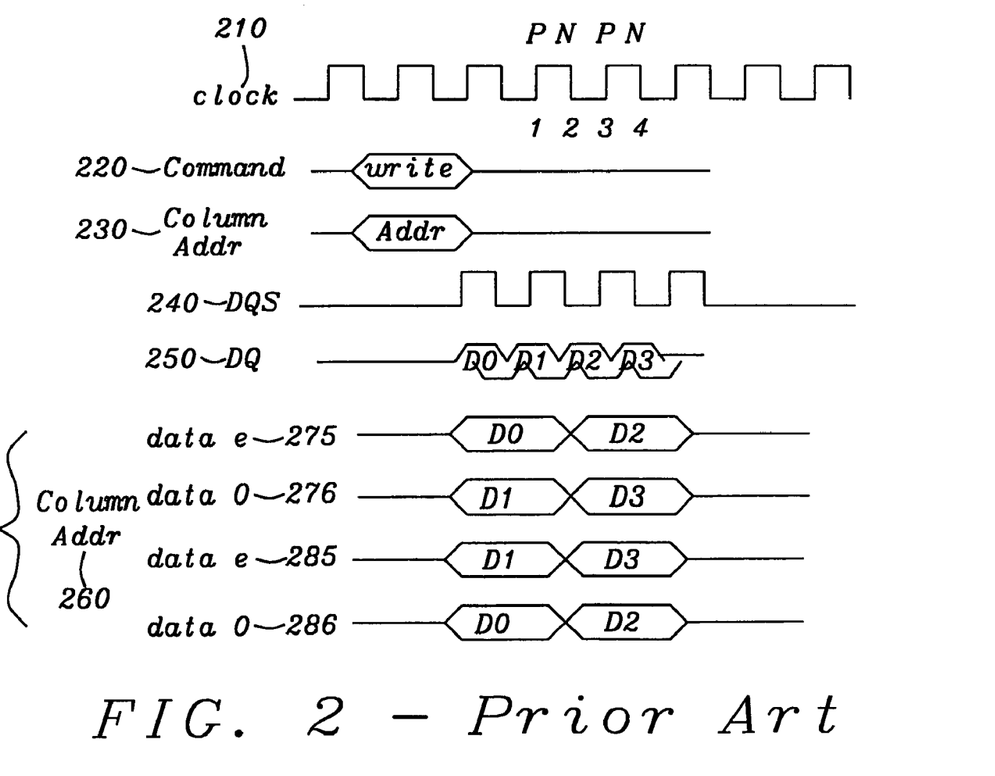
FIG. 2 is a prior art timing diagram illustrating a memory Write command in normal operation.

FIG. 2 shows the prior art timing diagram for the interface between the controller and the DDR SDRAM memory. The clock 210 is shown with four edges of the clock labeled P, N, P, N & 1, 2, 3. 0. This represents the positive and negative bits of data being accessed to & from the memory. The command window of time is shown 220. This time window shows a write command and the column address 230 occurring simultaneously. The DQS, data strobe occurs in a burst of 4 clock pulses on the clock cycle after the write command. The burst length, BL=4 (215) is labeled in FIG. 2. The data bus, DQ, shows the 4 bits D0, D1, D2, and D3 250 to be written into memory by the above write command 220. The column address 260 has a low order bit B0 270, 280 which is shown in FIG. 2. A B0=0 (270) results in a data_p 275 and a data_n 276.

A B0=1 280 results in a data_p 285 and a data_n 286 as shown in FIG. 2. If B0=0 270, data_p 275 transmits two positive bits D0, D2 into internal even data path and data_n transmits two odd bytes D1, D3 into internal odd data path. If B0=1 280, data_n 286 transmits two negative bits D1, D3 into internal even data path and data_p 285 transmits two positive bits D0, D2 into internal odd data path. To employ B0 address bit as a switch control bit to transfer the external input data of positive/negative system into the internal data of even/odd system.

Figure 3:
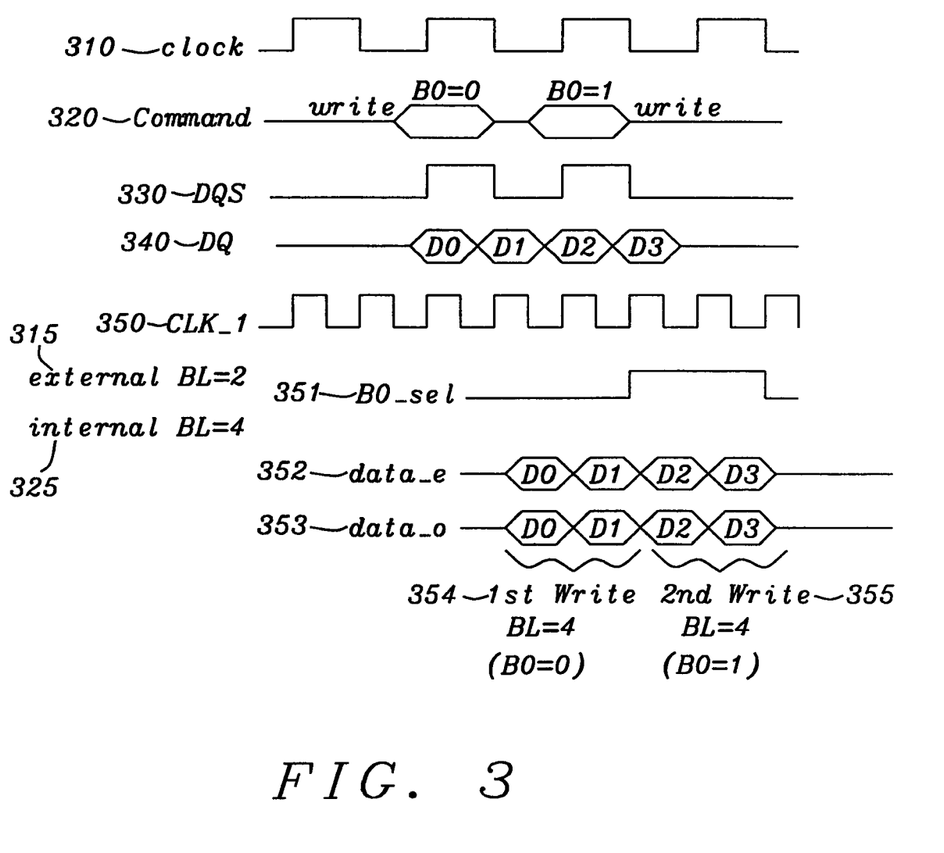
FIG. 3 is a prior art timing diagram illustrating a Write command operating in an internally doubling clock testing mode.

FIG. 3 shows the write command at internally doubling clock testing mode. The clock 310 is shown. The write command 320 is shown twice during two successive clock cycles. This indicates that the external burst length, BL=2 (315). The data bus DQ shows the 4 data bytes D0, D1, D2, D3 340 being strobed in on both the rising & falling edges of the DQS signal. An internal clock, 350 is shown. Its frequency is two that of the regular clock 310. This double speed internal clock 350 allows the normal internal burst length, BL=4 (325). The B0_sel 351 is shown when the B0 of the column address goes high. The data_even line 352 is shown with the two bytes D0 and D3. The data_odd line 353 is shown with the two bytes D1 & D2 shown.

For high speed or double speed stress testing of DDR SDRAM, the internal clock is double the speed of the external clock. In the prior art during high speed test, this causes the data to be written or presented to the data path two times. Therefore in the prior art a full double speed stress test does not completely test the double speed data transition circuit paths.

U.S. Pat. No. 6,337,830 (Faue) "Integrated clocking latency and multiplexer control technique for double data rate (DDR) synchronous dynamic random access memory (SDRAM) device data paths" describes an integrated clocking latency and multiplexer control technique for double data rate (DDR) synchronous dynamic random access memory (SDRAM) device data paths.

U.S. Pat. No. 6,154,419 (Shakkarwar) "Method and apparatus for providing compatibility with synchronous dynamic random access memory (SDRAM) and double data rate (DDR) memory" describes a method and an apparatus for providing compatibility with synchronous dynamic random access memory (SDRAM) and double data rate (DDR) memory.

U.S. Pat. No. 6,043,694 (Dortu) "Lock arrangement for a calibrated DLL in DDR SDRAM applications" describes a lock arrangement for a calibrated DLL in DDR SDRAM applications.

SUMMARY OF THE INVENTION

It is therefore an object of the present invention to provide a circuit and a method for the full speed testing of semiconductor memory chips. It is further an object of this invention to provide a full-speed data transition scheme for double data rate (DDR) synchronous dynamic random access memory (SDRAM).

The objects of this invention are achieved by a semiconductor integrated circuit with full-speed data transition scheme for double data rate (DDR) synchronous dynamic random access memory (SDRAM) at internally doubled clock testing application made up of a pulse generator whose output is attached to the clear input of a toggle flip flop, and whose input is a write line of the memory. It also contains an AND circuit whose output is attached to the clock input of said D-toggle flip-flop, and whose first input is an internal clock and whose second input is an enable signal. It also contains a toggle flip-flop, which has a data input which comes from a feedback from the inverse or QN output of said flip flop, a clock input, a clear input and a Q or true output. The circuit of the invention also has an exclusive-OR circuit whose one input comes from the true Q-output of the D-toggle flip-flop, whose other input is the B0-select signal and whose output is an external select signal. The invention also contains a multiplexer circuit whose one input is the data input-positive bit, whose other input is the data-input negative bit, whose select line is the external select line from the exclusive-OR circuit, whose one output is a data input-even bit and whose other output is a data input-odd bit.

The above and other objects, features and advantages of the present invention will be better understood from the following detailed description taken in conjunction with the accompanying drawings.

DESCRIPTION OF THE PREFERRED EMBODIMENT

Figure 4:
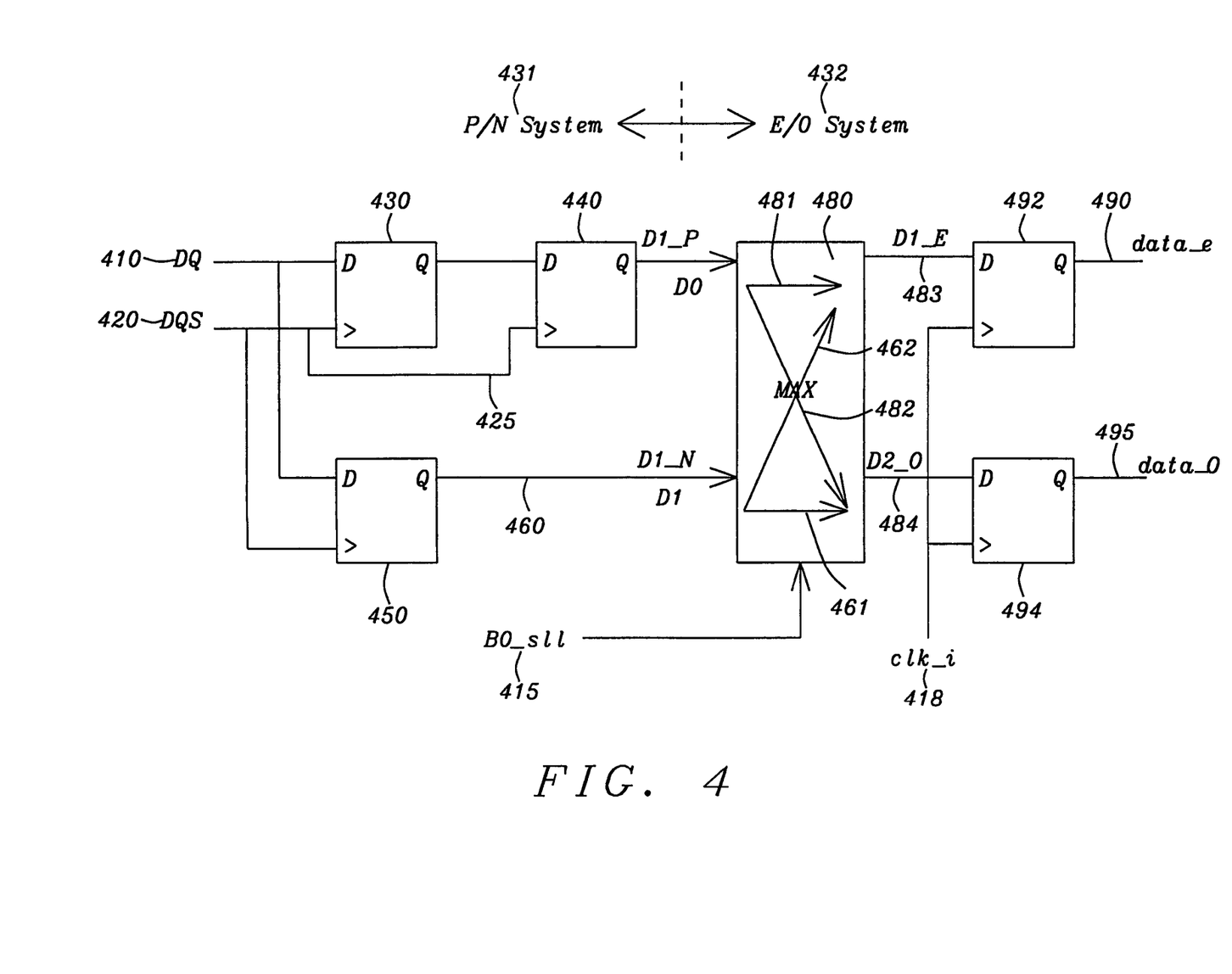
FIG. 4 shows a schematic of the input stage of this invention.

FIG. 4 shows a schematic of the data bus, DQ input stage within the DDR SDRAM. This circuit takes in the DQ 410 input and the data strobe DQS 420 from the controller circuiting of FIG. 1 and outputs data_even 490 and data_odd 495. The purpose of this DQ input stage is to convert the input data bytes from a positive and negative bit arrangement 431 to an even and odd bit arrangement 432.

First, the DQ signal 410 goes into a data input of a D-toggle flip-flop 430. The DQS strobe goes into a clock input of the D-flip flop 430. The positive data output, Q of this first D-flip-flop goes into the data input of a second D-flip flop 440. In addition, the strobe, DQS goes into the clock input of this second D-flip flop 440. Both the DQ input and the DQS input feed the data-in and clock inputs of a third D-flip flop 450 as shown in FIG. 4. The output, Q 460 of this third D-flip flop 450 becomes the data in negative input 460, which feeds one side of a multiplexer 481. The signal, which does the selection of which side of the multiplexer 481 is placed at the multiplexer 481 outputs is the bit 0 of the memory column address 415 as shown in FIG. 4. One output of the multiplexer is the data-even bus 483. The second output of the multiplexer is the data-odd bus 484. [If the select signal, B0-select is low or zero, the Data-In positive multiplexer input 470 becomes the Data-In even output 483, and the Data-On negative multiplexer input 460 becomes the Data-In Odd output 484.

DQ is sampled by the DQS rising edge at D-flip flop 430. The output data Q of 430 is the so called, "positive data". DQ is sampled by the DQS falling edge at D-flip flop 450. The output data Q of 450 is the so called, "negative data". Because the Q of 430 is leading the Q of 450, a half-cycle ahead, we employ D-flip flop 440 to resample the Q of 430 ("positive data") by the DQS falling edge. Now, DI_p 470 and DI_n 460 are well-aligned.

If the multiplexer select signal B0-select is high or one, the Data-In positive multiplexer input 470 becomes the Data-In Odd 484 multiplexer output, and the Data-In negative multiplexer input 460 becomes the Data-In Even 483 multiplexer output.]

The Data-In Even 483 multiplexer output feeds the Data Input of a fourth D-flip flop 492. The clock input of this fourth D-flip flop is fed by an internal clock, clk_i 418. The positive output of this fourth D-flip flop is data_even, data_e 490. The Data-In Odd 484 multiplexer output feed the Data Input of a fifth D-flip flop 494. The clock input to this fifth D-flip flop is also clk_i 418. The positive output of this fifth flip-flop 494 is data-odd, data_O 495.

Figure 5A:
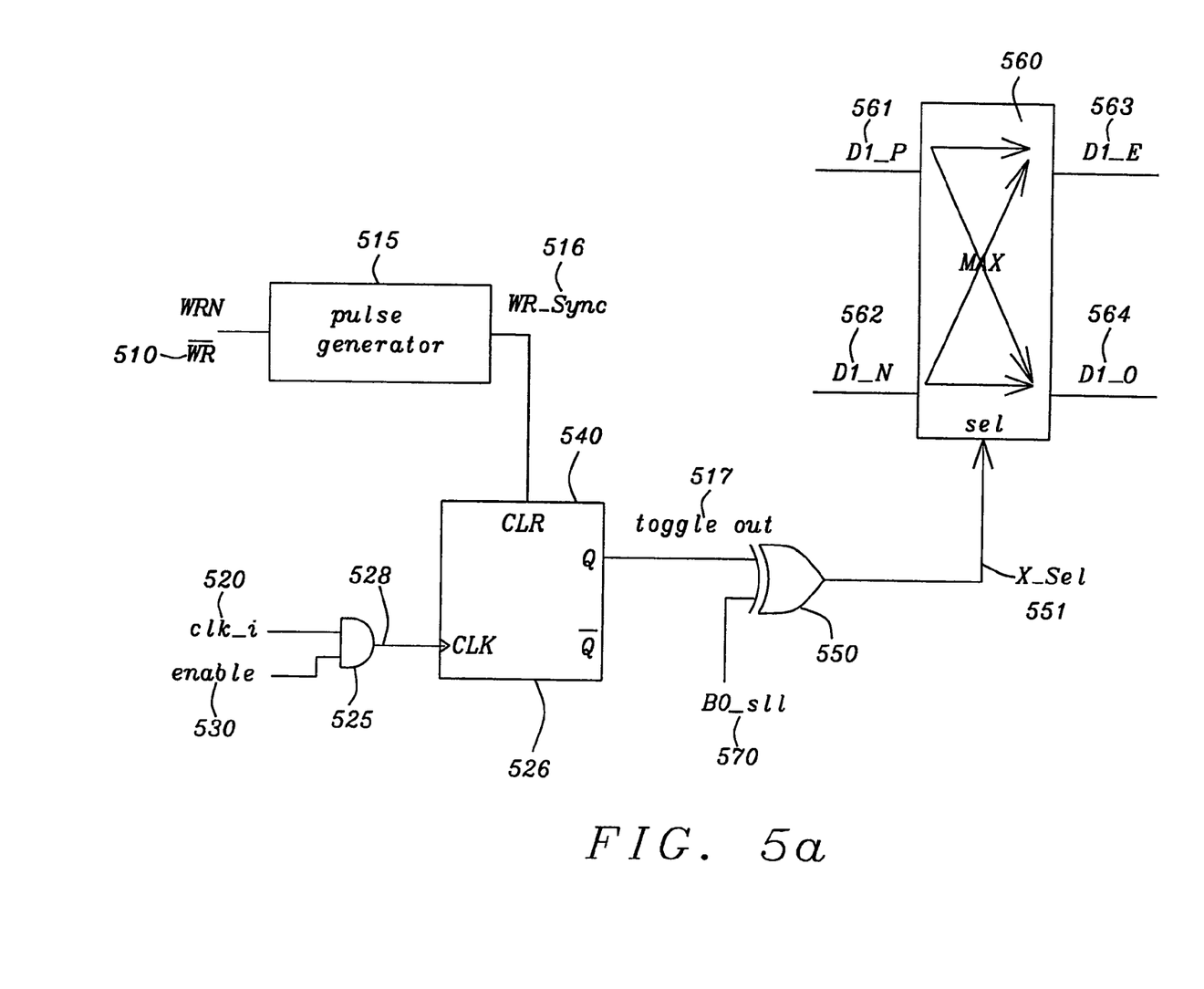
FIG. 5a shows a schematic of the best embodiment of this invention.

FIG. 5a shows the best circuit embodiment of this invention. The output Q 517 is reset to zero when input CLR (clear) 516 is High. The output, Q 517 will be toggled or inverted at each rising edge of the clock signal, 528.

The multiplexer function 560 is shown. The Data-In positive 561 and the Data-In negative 562 are shown. Instead of using the column address Bit 0 as the select line as in FIG. 4, a new signal, external select, ex_sel, 551 is developed in FIG. 5. The multiplexer outputs are Data-In Even 563 and Data-In Odd 564. If the select signal, ex-sel 551 is low or zero, the Data-In positive multiplexer input 561 becomes the Data-In even output 563, and the Data-In negative multiplexer input 562 becomes the Data-inn odd output 564.

If the multiplexer select signal ex-sel 551 is high or one, the Data-In positive multiplexer input 561 is high or one, the Data-In positive multiplexer input 561 becomes the Data-In odd multiplexer output 564 and the Data-In negative multiplexer input 562 becomes the Data-In Even 563 multiplexer output.

In FIG. 5a, the ex-sel 551 signal is developed as follows. The memory WRITE signal WRN, 510 feeds into a pulse generator 515. The output of the pulse generator 515 is WR_SYNC 516 pulse feeds into the CLEAR, CLR input of the D-toggle flip flop 540. An internal clock, clk_i 520 and an enable signal 530 both feed into a 2-input AND circuit 525. The output 528 of this AND circuit 525 feeds into the clk input of the D-flip flop 540. The negative output 526 of the D-flip flop 540 feeds into the data input of the same D-flip flop.

The positive output 517 of the self-toggling circuit 540 goes into an Exclusive-OR gate 550. The other input to the exclusive-OR gate is the column address Bit_0 select line 570. The output of this Exclusive-OR gate 550 becomes the ex_sel line 551.

Figure 5B:
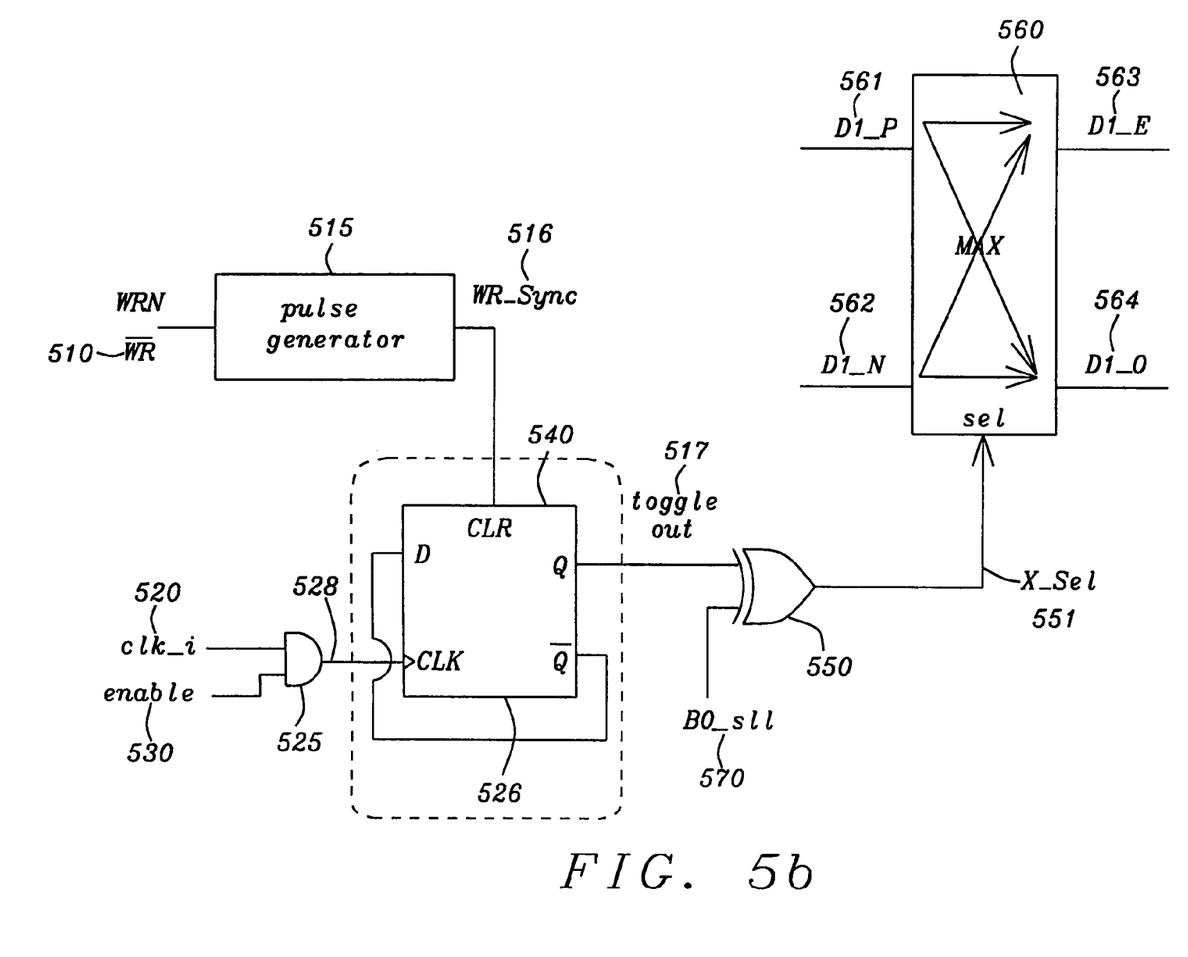
FIG. 5b shows a schematic of the second best embodiment of this invention.

FIG. 5b shows the second best circuit embodiment of this invention. Instead of a self-toggling circuit which is used in FIG. 5a, this figure shows a D-flip flop implementation with the flip flop input coming from the inverse output of the flip flop.

Figure 5C:
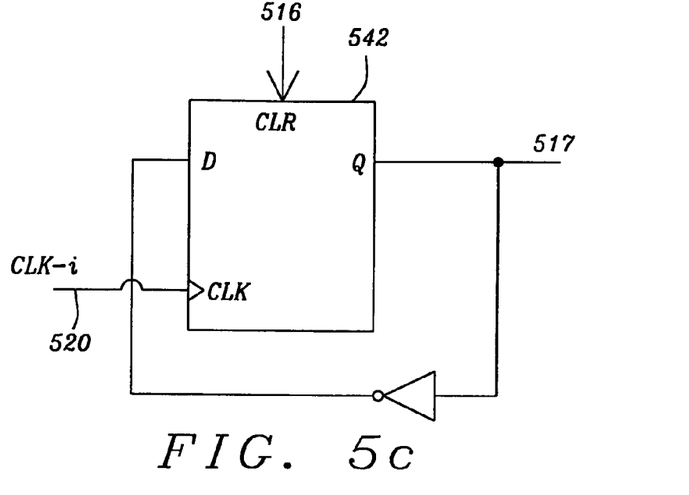
FIG. 5c shows a schematic of the third best embodiment of this invention.

FIG. 5c shows the $3^{rd}$ best circuit embodiment of this invention. Instead of a self-toggling circuit which is used in FIG. 5a, this figure shows a D-flip flop implementation with the flip flop input coming from an inversion of the true output.

Figure 5D:
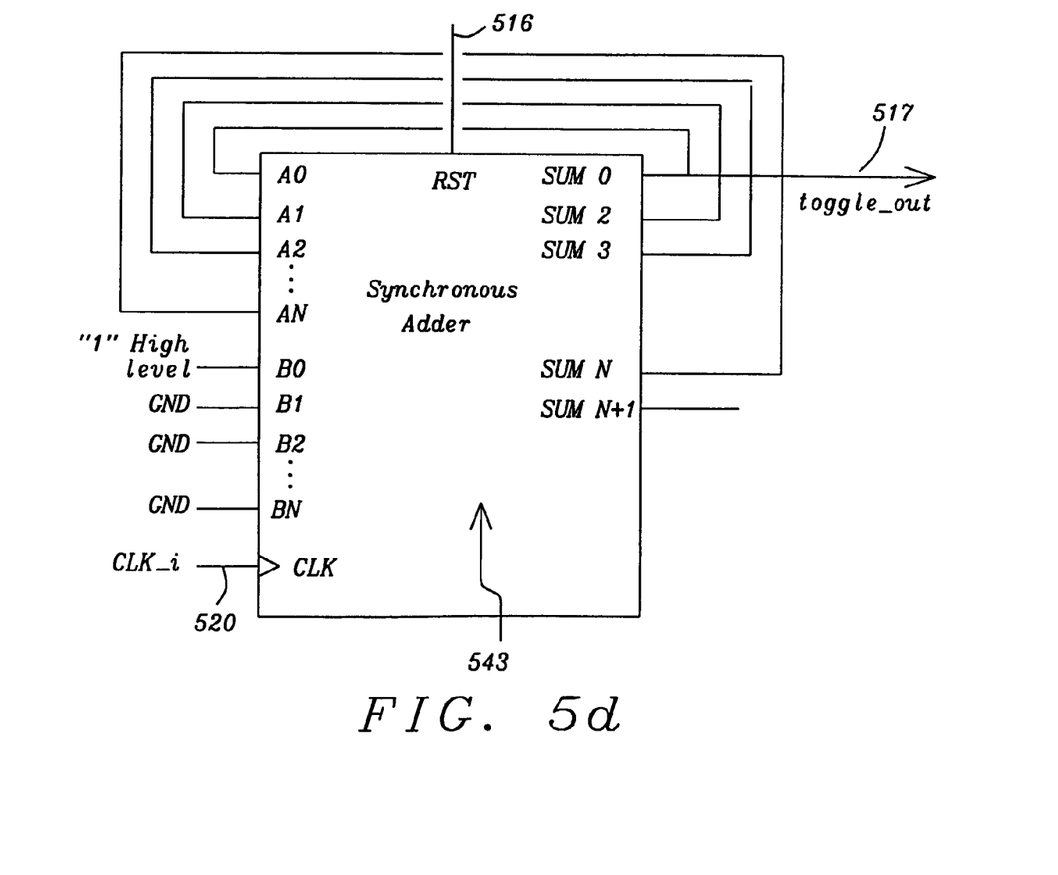
FIG. 5d shows a schematic of the fourth best embodiment of this invention.

FIG. 5d shows the 4th best circuit embodiment of this invention. Instead of a self-toggling circuit which is used in FIG. 5a, this figure replaces the self-toggling circuit of FIG. 5a with a synchronous multi-bit adder 543.

Figure 6:
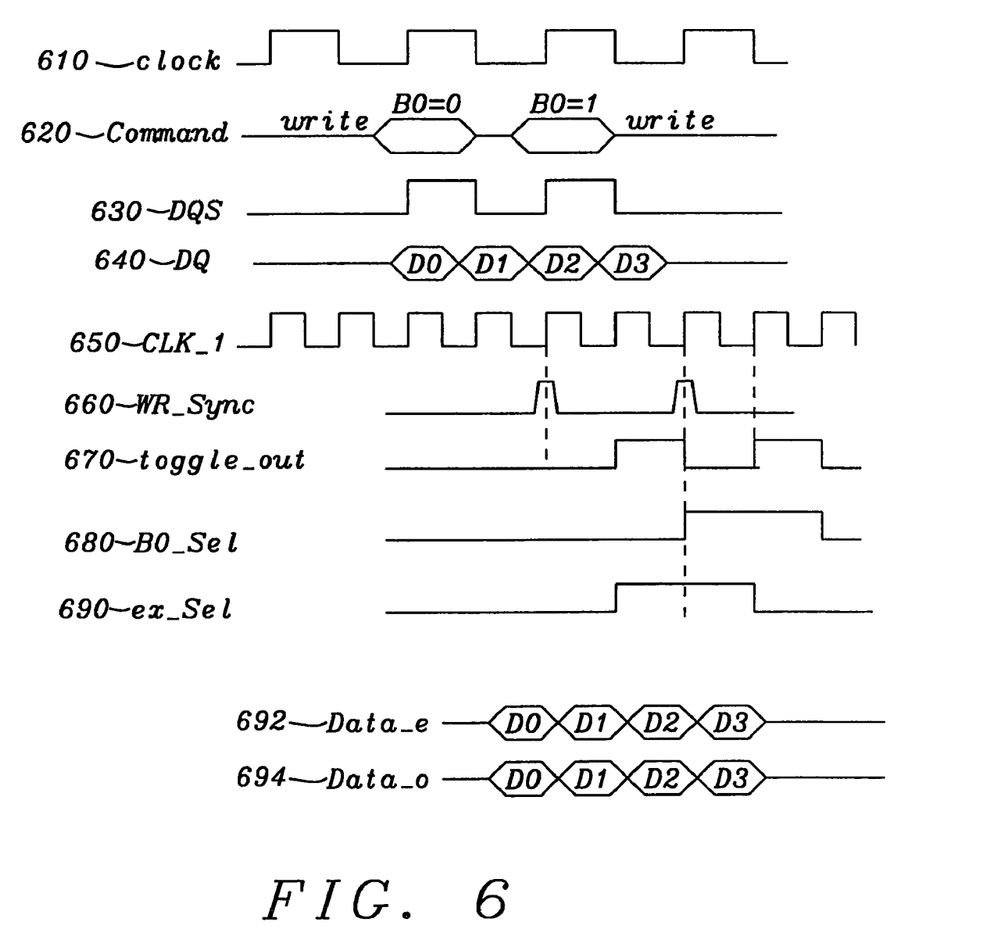
FIG. 6 shows a timing diagram of the operation of the main embodiment of this invention.

FIG. 6 shows a timing diagram for the main embodiment of this invention. The main clock, 610 is shown as well as the command bus 620. The command bus 620 shows two WRITE windows, one for the B0=0 state and one for the B0=1 state. The data bus, DQ 640 shows the sequence of four bytes D0, D1, D2, D3. The data strobe, DQS 630 is shown with a Burst Length, BL=2. This means DQS 630 occurs for one cycle of the clock 610 for each Write command. FIG. 6 also shows the double speed internal clock, clk_I 650.

The signals represented in FIG. 5 are also shown in the timing diagram of FIG. 6. The WR_SYNC 660 line shows two pulses, which were produced by the two write commands shown 620. The toggle-out 670 signal shows the resultant output of the D-toggle flip flop 540. The B0_sel 680 line is shown as well as the ex_sel line 690. The resultant Data_even 692 and Data_odd lines 694 are shown. Notice the order of data bits for Data_e 692 is D0, D1, D3, and D2. Also notice the order of data bits for Data_o 694 is D1, D0, D2, D3. This ordering allows the successful double speed testing of double data rate DDR, synchronous SDR data dynamic random access memory SDRAM.

The advantage of this invention is that full double speed testing can be accomplished, even with the data transitions. For high speed or double speed stress testing of double data rate (DDR) synchronous dynamic random access memory (SDRAM), the internal clock is double the speed of the external clock. During high speed testing, this causes the data to be written or presented to the data path two times. This invention provides a circuit and method for creating a full-speed data transition scheme to overcome this double speed testing problem.

While the invention has been described in terms of the preferred embodiments, those skilled in the art will recognize that various changes in form and details may be made without departing from the spirit and scope of the invention.

What is claimed is:

1. A semiconductor integrated circuit with full-speed data transition scheme for double data rate (DDR) synchronous dynamic random access memory (SDRAM) at internally doubled clock testing application comprising:

a pulse generator having an output attached to a clear input of a self-toggling circuit, and having an input which is a write line from a memory controller, a synchronous multi-bit adder having N data input lines coupled to summation outputs through N feedback lines of said multi-bit adder, wherein said multi-bit adder having N additional inputs which are forced to (0, 0 . . . 1), a clock input and a clear input, an exclusive-OR circuit having one input which comes from said true output of said self-toggling circuit, having another input which is a select signal and having an output which is an external select signal, and a multiplexer circuit having one input which is the positive data input-bit, having another input which is the negative data-input bit which is the inverse of said positive data input bit, having a select line which is said external select line from said exclusive-OR circuit, having one output which is a data input-even bit and having another output which is a data input-odd bit, wherein said integrated circuit provides full-speed testing of said synchronous dynamic random access memory (SDRAM).

2. The semiconductor integrated circuit with full-speed data transition scheme of claim 1 wherein said pulse generator is used for generating a reset pulse each time said write input line goes active.

3. The semiconductor integrated circuit with full-speed data transition scheme of claim 1 wherein said exclusive-OR circuit produces an external select whenever said toggle output and said select input are of different logic levels.

4. The semiconductor integrated circuit with full-speed data transition scheme of claim 1 wherein said multiplexer transfers said positive data-input bits to said data-in even and transfers said negative data input bits to said data-in odd, where said select input=0.

5. The semiconductor integrated circuit with full-speed data transition scheme of claim 1 wherein said multiplexer transfer, positive data-input bits to said data-in odd bits, and transfer said negative data-input bits to said data-in even bits, when said select signal=1.

6. The semiconductor integrated circuit with full-speed data transition scheme of claim 1 wherein interface signals between said memory controller has two major interface signals to the double data rate synchronous dynamic random access memory (DDR SDRAM), a data strobe and said data bus.

7. The semiconductor integrated circuit with full-speed data transition scheme of claim 1 wherein said data strobe signal is used to latch or capture the data bit signal on the rising edge of said data strobe signal.

8. The semiconductor integrated circuit with full-speed data transition scheme of claim 1 wherein said data strobe signal is inverted and used to latch or capture the data bit signal on the falling edge of said data strobe signal.

9. The semiconductor integrated circuit with full-speed data transition scheme of claim 1 wherein said data strobe signal is inverted and used to latch or capture said output of said previously latched data bit signal on the falling edge of said data strobe signal.

10. A method of designing a semiconductor integrated circuit with full-speed data transition scheme for double data rate (DDR) synchronous dynamic random access memory (SDRAM) at internally doubled clock testing application comprising the steps of:

including a pulse generator having an output attached to a clear input of a self-toggling circuit, and having an input which is a write line from a memory controller, including a synchronous multi-bit adder having N data input lines coupled to summation outputs through N feedback lines of said multi-bit adder, wherein said multi-bit adder having N additional inputs which are forced to (0, 0 . . . 1), a clock input and a clear input, including an exclusive-OR circuit having one input which comes from said true output of said self-toggling circuit, having another input which is a select signal and having an output which is an external select signal, and including a multiplexer circuit having one input which is the positive data input-bit, having another input which is the negative data-input bit, which is the inverse of said positive data input bit, having a select line which is said external select line from said exclusive-OR circuit, having one output which is a data input-even bit and having another output which is a data input-odd bit, wherein said integrated circuit provides full-speed testing of said synchronous dynamic random access memory (SDRAM).

11. The method of designing a semiconductor integrated circuit with full-speed data transition scheme of claim 10 wherein said pulse generator is used for generating a reset pulse each time said write input line goes active.

12. The method of designing a semiconductor integrated circuit with full-speed data transition scheme of claim 10 wherein said exclusive-OR circuit produces an external select whenever said toggle output and said select input are of different logic levels.

13. The method of designing a semiconductor integrated circuit with full-speed data transition scheme of claim 10 wherein said multiplexer transfers said positive data-input bits to said data-in even and transfers said negative data-input bits to said data-in odd, where said select input=0.

14. The method of designing a semiconductor integrated circuit with full-speed data transition scheme of claim 10 wherein said multiplexer transfer, said positive data-input bits to said data-in odd bits, and transfer said negative data-input bits to said data-in even bits, when said select signal=1.

15. The method of designing a semiconductor integrated circuit with full-speed data transition scheme of claim 10 wherein interface signals between said memory controller has two major interface signals to the double data rate synchronous dynamic random access memory (DDR SDRAM), a data strobe and said data bus.

16. The method of designing a semiconductor integrated circuit with full-speed data transition scheme of claim 10 wherein said data strobe signal is used to latch or capture the data bit signal on the rising edge of said data strobe signal.

17. The method of designing a semiconductor integrated circuit with full-speed data transition scheme of claim 10 wherein said data strobe signal is inverted and used to latch or capture the data bit signal on the falling edge of said data strobe signal.

18. The method of designing a semiconductor integrated circuit with full-speed data transition scheme of claim 10 wherein said data strobe signal is inverted and used to latch or capture said output of said previously latched data bit signal on the falling edge of said data strobe signal.

* * * * *